United States Patent
Lin et al.

(10) Patent No.: US 10,304,993 B1
(45) Date of Patent: May 28, 2019

(54) LIGHT-EMITTING DEVICE AND METHOD OF MANUFACTURING THE SAME

(71) Applicant: EPISTAR CORPORATION, Hsinchu (TW)

(72) Inventors: Yung-Hsiang Lin, Hsinchu (TW); Wei-Chih Peng, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/863,255

(22) Filed: Jan. 5, 2018

(51) Int. Cl.
- H01L 33/00 (2010.01)
- H01L 33/12 (2010.01)
- H01L 33/10 (2010.01)
- H01L 33/06 (2010.01)

(52) U.S. Cl.
CPC ............ *H01L 33/12* (2013.01); *H01L 33/007* (2013.01); *H01L 33/06* (2013.01); *H01L 33/105* (2013.01)

(58) Field of Classification Search
CPC ....... H01L 33/20; H01L 33/22; H01L 33/505; H01L 33/405; H01L 33/58; H01L 33/60; H01L 2933/0091; H01L 33/46; H01L 33/502
See application file for complete search history.

(56) References Cited

U.S. PATENT DOCUMENTS

| | | | | |
|---|---|---|---|---|
| 8,692,280 B2* | 4/2014 | Yeh | ...................... | H01L 31/0682 257/776 |
| 9,117,967 B2* | 8/2015 | Teramae | .................. | C03C 15/00 |
| 9,231,024 B2* | 1/2016 | Tao | ........................ | H01L 27/153 |
| 9,461,204 B2* | 10/2016 | Huang | ..................... | H01L 33/20 |
| 9,583,573 B2* | 2/2017 | Tun | ....................... | H01L 31/1852 |
| 2012/0228656 A1* | 9/2012 | Kamiyama | ............. | H01L 33/22 257/98 |
| 2014/0167066 A1* | 6/2014 | Kashima | ................. | H01L 33/20 257/76 |
| 2014/0312004 A1* | 10/2014 | Suzuki | ................... | H01L 33/007 216/48 |
| 2016/0005923 A1* | 1/2016 | Suzuki | .................... | H01L 33/20 257/98 |
| 2016/0111599 A1* | 4/2016 | Ohya | ...................... | H01L 33/10 257/98 |
| 2016/0149076 A1* | 5/2016 | Kitano | ................... | H01L 33/10 257/98 |
| 2017/0133548 A1* | 5/2017 | Kitano | ............... | H01L 33/0075 |

\* cited by examiner

*Primary Examiner* — Jaehwan Oh
(74) *Attorney, Agent, or Firm* — Muncy, Geissler, Olds & Lowe, P.C.

(57) ABSTRACT

The present invention discloses a light-emitting device and the manufacturing method thereof. The light-emitting device comprises: a substrate including a protrusion part and a base part; a lattice buffer layer formed on the substrate and including a first region substantially right above the protrusion part and a second region substantially right above the base part, wherein the first region includes a recess therein; a light-emitting stack formed on the lattice buffer layer and the recess; and electrodes formed on and electrically connected to the light-emitting stack.

10 Claims, 3 Drawing Sheets

LIGHT-EMITTING DEVICE AND METHOD OF MANUFACTURING THE SAME

BACKGROUND OF INVENTION

1. Field of the Invention

The present disclosure relates to a light-emitting device, and more particularly, to a high efficiency light-emitting device with improved external quantum efficiency.

2. Description of the Related Art

Light-emitting diodes (LEDs) are generally made of III-V compound semiconductors to convert electric energy into optical energy, i.e. light. Depending on the composition of the compound semiconductors, light-emitting diodes is capable of emitting light such as infra-red light (IR light), visible light, ultraviolet light (UV light). Among the various LEDs, UV LEDs are implemented in diverse applications, most of which are based on the interaction between UV radiation and biological materials. Typical applications include surface sterilization, water purification, medical devices and biochemistry, light sources for ultra-high density optical recording, white lighting, fluorescence analysis, sensing, and zero-emission automobiles. Therefore, research and development of high efficiency UV LED has become a main topic of the industry.

SUMMARY OF THE INVENTION

The present disclosure provides a light-emitting device and a method of manufacturing the same.

The manufacturing method of the light-emitting device of the present disclosure includes the steps of: providing a substrate, wherein the substrate includes a protrusion part and a base part; forming a lattice buffer layer on the substrate, wherein the lattice buffer layer includes a first region and a second region, the first region is substantially right above the protrusion part, and the second region is substantially right above the base part; removing a portion of the first region to form a recess in the lattice buffer layer; forming a light-emitting stack on the lattice buffer layer and the recess, wherein the light-emitting stack includes an n-type semiconductor layer, an active layer and a p-type semiconductor layer; and forming a first electrode and a second electrode, electrically connected to the n-type semiconductor layer and the p-type semiconductor layer respectively.

The light-emitting device of the present disclosure includes a substrate, comprising a protrusion part and a base part; a lattice buffer layer, formed on the substrate, wherein the lattice buffer layer includes a first region and a second region, wherein the first region is substantially right above the protrusion part, and the second region is substantially right above the base part, a recess formed in the first region of the lattice buffer layer other than the second region; a light-emitting stack, formed on the lattice buffer layer and the recess, wherein the light-emitting stack includes a n-type semiconductor layer, an active layer and a p-type semiconductor layer; and a first electrode and a second electrode, electrically connected to the n-type semiconductor layer and the p-type semiconductor layer respectively.

DETAILED DESCRIPTION OF THE PREFERRED EMBODIMENTS

Though the materials forming the devices described herein are III-nitride compound, devices composed of other materials such as other III-V compounds, II-VI compounds, or Si are within the scope of the present disclosure. The devices described herein may be configured to emit light including but not limited to UV A (peak wavelength between 340 and 400 nm), UV B (peak wavelength between 290 and 340 nm), or UV C (peak wavelength between 210 and 290 nm) light.

The embodiments of the present disclosure will be described below with referring to the accompanying drawings.

Figure 1A:
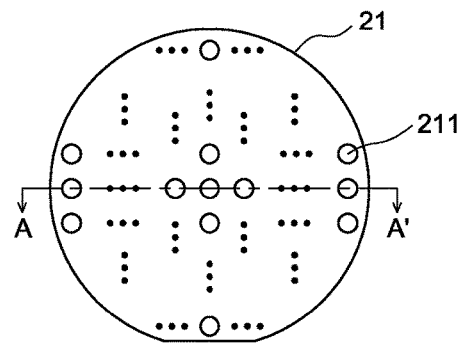
FIGS. 1A through 1B illustrate a top view of a substrate with a plurality of the protrusion parts formed on the substrate.
Figure 1B:
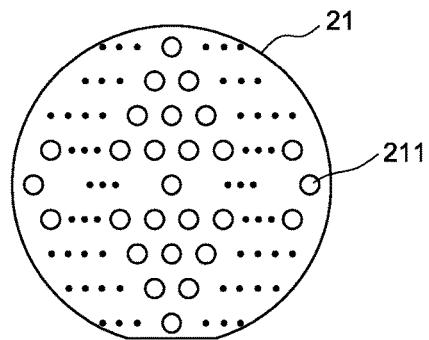

FIG. 1A shows a top view of a substrate 21 with a plurality of protrusion parts 211 arranged in a 2D square array according to one embodiment of the present disclosure. FIG. 1B shows a top view of the substrate 21 with the plurality of protrusion parts 211 arranged in a 2D HCP (hexagonal close-packed) array according to another embodiment of the present disclosure.

Figure 2A:
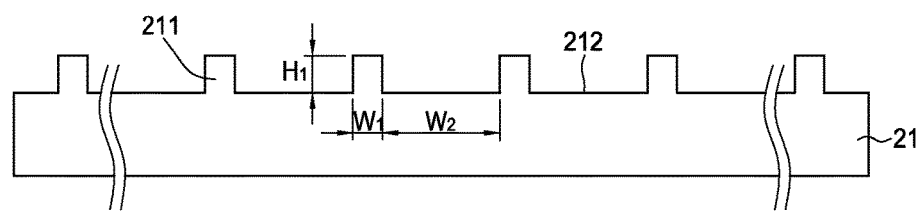
FIGS. 2A through 2F illustrate a method of manufacturing a light-emitting device according the embodiments of the present disclosure.

FIGS. 2A through 2F illustrates a method of manufacturing a light-emitting device 2 according to an embodiment of the present disclosure. Referring to FIG. 2A, the method comprises proving the substrate 21 with the plurality of protrusion parts 211 and the plurality of base parts 212 each of which sandwiched by adjacent protrusion parts 211 from a cross-sectional view. The substrate 21 includes, but not limited to, a sapphire substrate. The protrusion parts 211 include the same material as the substrate 21. The protrusion part 211 is a submicron structure, and includes a bottom width W1 between 10 nm and 1000 nm and a height H1 between 10 nm and 1000 nm. Preferably, the protrusion part 211 includes a bottom width W1 which is 2-3 times the wavelength of the light emitted from the light-emitting device 2 and a height H1 between 200 nn and 500 nm. The base part 212 includes a bottom width W2 between 10 nm and 3000 nm. Preferably, the base part 212 includes a bottom width W2 which is 2-3 times the wavelength of the light emitted from the light-emitting device 2. Furthermore, the protrusion part 211 comprises a cylindrical structure, a hemispherical structure, an elliptical structure, a cone structure, a pyramid structure, or a volcano structure. For the purpose of illustration, each of the protrusion parts 211 in the embodiment is a cylindrical structure and is a rectangle in the cross-sectional view taken along line A-A' of the substrate 21 in FIG. 1A.

Figure 2B:
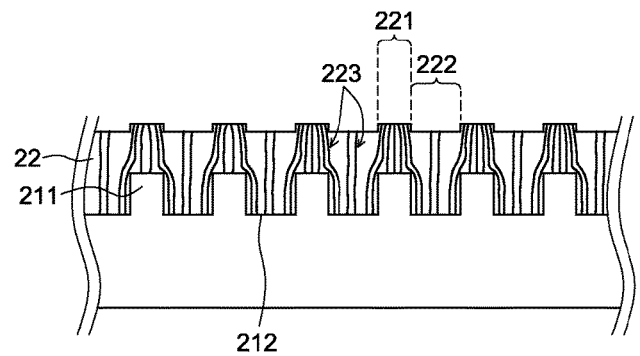

Then, as shown in FIG. 2B, the method further comprises forming a lattice buffer layer 22 on the substrate 21 by deposition process, such as metal-organic chemical vapor deposition (MOCVD), molecular beam epitaxy (MBE), etc. The lattice buffer layer 22 includes, but not limited to, an aluminum nitride (AlN) layer. The thickness of the lattice buffer layer 22 is smaller than 1000 nm. Preferably, the thickness of the lattice buffer layer 22 is 1-3 times the height H1 of the protrusion part 211. During growing the lattice buffer layer 22, lattice defects 223 such as threading dislocation occur due to a mismatch in the lattice constants between the lattice buffer layer 22 and the substrate 21. As the lattice buffer layer 22 grows, a portion of the lattice defects 223 extend upwards from the top surface of the protrusion parts 211 and the surface of the base parts 212, and another portion of the lattice defects 223 extend from the surface of the base parts 212 and then bend laterally to gather at the region right above each of the protrusion part 211. Therefore, the lattice buffer layer 22 includes a first region 221 substantially right above each of the protrusion part 211 and a second region 222 substantially right above the base part 212, wherein the first region 221 has a defect density more than that of the second region 222.

Figure 2C:
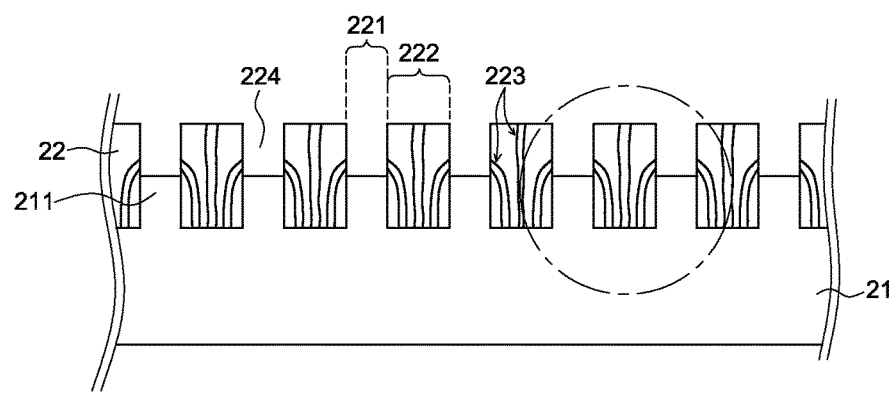
Figure 2C:
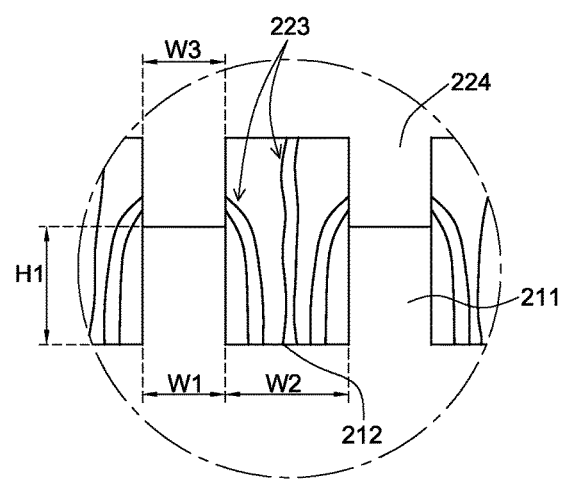

The lattice defects embedded in the lattice buffer layer 22 is capable of extending into the subsequent grown epitaxial layers. Therefore, as shown in FIG. 2C, the method further comprises a step of removing a portion of each first region 221 by wet etching or dry etching to form a recess 224 corresponding to each first region 221. A patterned mask (not shown) is formed on the second regions 222 and exposes the first regions 221 of the lattice buffer layer 22. The mask protects the second regions 222 from being etched. After the recesses 224 are formed by the etching step, the mask is removed. From the top view, the shape of the recesses 224 can be circular, elliptical rectangular, or polygonal. From the cross-sectional view, the shape of the recesses 224 can be rectangle or inverted trapezoid. For the purpose of illustration, the shape of each recess 224 in the embodiment is rectangle. The recess 224 includes a bottom width W3 which is 1-3 times the top width of the protrusion part 211. In the present embodiment, the bottom of the recess 224 reaches the top surface of the protrusion part 211. In another embodiment, the bottom of the recess 224 can be further below the top surface of the protrusion part 211.

Figure 2D:
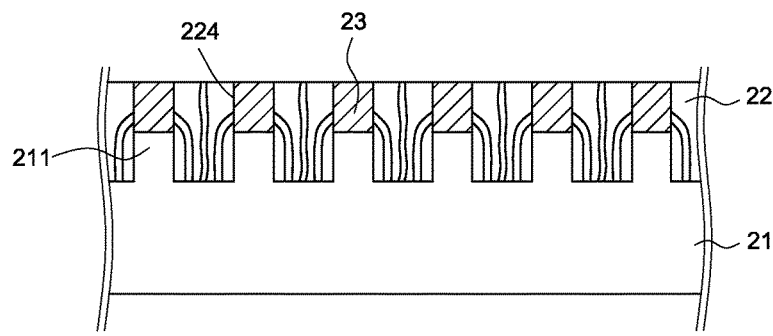
Figure 2E:
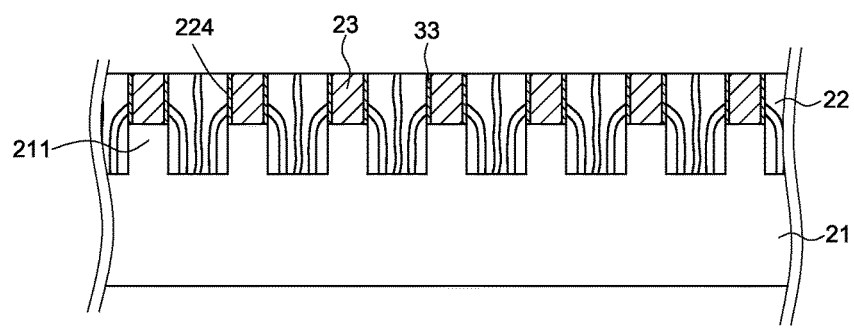

As FIG. 2D shows, the method further comprises forming defect-blocking structures 23 in the recesses 224 correspondingly. Preferably, each recess 224 is substantially filled up with the respective defect-blocking structure 23 that is not extended to the second region 222 of the lattice buffer layer 22. The material of the defect-blocking structure 23 includes a material for blocking the lattice defects 223 from extending into a subsequently grown light-emitting stack 24. The material of the defect-blocking structure 23 comprises a non-single crystal material. The material of the defect-blocking structure 23 comprises insulating oxide such as silicon oxide, titanium oxide or zirconium oxide, or insulating nitride such as silicon nitride, titanium nitride or boron nitride. Referring to FIG. 2E, the method further comprises forming a reflective layer 33 on the side wall of each recess 224 before forming the defect-blocking structures 23 in the recesses 224. Preferably, the reflective layer 33 is also formed on the bottom of each recess 224 for reflecting the light emitted from the side of the light-emitting device 2 to be away from the substrate 21. The material of the reflective layer 33 includes metal such as silver (Ag), aluminum (Al), gold (Au), titanium (Ti), copper (Cu), platinum (Pt), nickel (Ni), rhodium (Rh), or an alloy of the above materials, or a Distributed Bragg reflector (DBR) which is formed by two or more layers having different refractive indexes alternately stacked. The reflective layer 33 has a reflectivity greater than 80% to the light emitted from the light-emitting device. The reflective layer 33 is optional and can be omitted from the light-emitting device.

Figure 2F:
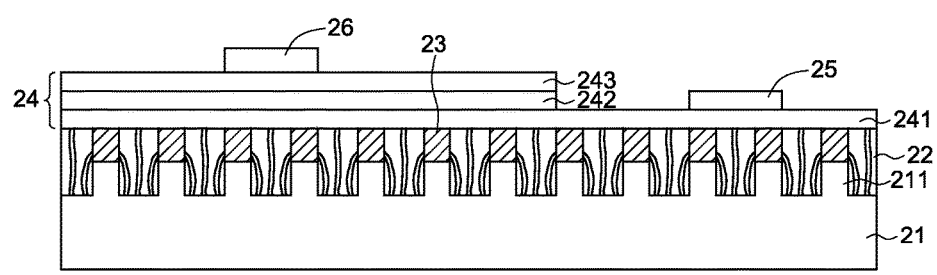

Then, as FIG. 2F shows, the method further comprises forming a light-emitting stack 24 on the lattice buffer layer 22 and the defect-blocking structures 23. The light-emitting stack 24 comprises an n-type semiconductor layer 241 grown on the lattice buffer layer 22 and the defect-blocking structures 23, an active layer 242 grown on the n-type semiconductor layer 241 and a p-type semiconductor layer 243 grown on the active layer 242. During growing the light-emitting stack 24, a part of the n-type semiconductor layer 241 is firstly epitaxy grown from the second region 222 and then laterally grown to cover the defect-blocking structures 23 on the first region 221 by Epitaxial Lateral Overgrowth (ELOG). Because the n-type semiconductor layer 241 is not capable of being directly grown from the defect-blocking structures 23, the lattice defects 223 are blocked by the defect-blocking structures 23 accordingly. Preferably, the refractive index of the defect-blocking structure 23 is greater than that of the substrate 21 and smaller than that of the n-type semiconductor layer 241 to facilitate light extracted out of the substrate 21.

In one embodiment, the n-type semiconductor layer 241 comprises a n-type cladding layer which includes Si-doped $In_{x1}Al_{y1}Ga_{1-x1-y1}N$ wherein $0 \leq x1 < 1$ and $0 < y1 \leq 1$, the p-type semiconductor layer 243 comprises a p-type cladding layer which includes Mg-doped $In_{x2}Al_{y2}Ga_{1-x2-y2}N$ wherein $0 \leq x2 < 1$ and $0 < y2 \leq 1$, and the active layer 242 includes multiple well layers and multiple barrier layers alternately stacked wherein the material of each well layer includes undoped $In_{x3}Al_{y3}Ga_{1-x3-y3}N$ wherein $0 \leq x3 < 1$ and $0 < y3 \leq 1$ and the material of each barrier layer includes Si-doped $Al_{x4}Ga_{1-x4}N$ wherein $0 \leq x4 < 1$ and a Si-doped concentration from $1 \times 10^{17}$ cm$^{-3}$ to $1 \times 10^{19}$ cm$^{-3}$. Each of the barrier layers has an energy band gap greater than that of each of the well layers. Preferably, the light emitted from the active layer 242 is ultraviolet light having a peak wavelength substantially between 210 nm and 400 nm. In a preferred embodiment, the material of the n-type cladding layer includes Si-doped $Al_{x1}Ga_{1-x1}N$ wherein $0.3 \leq x1 \leq 1$ and a Si-doped concentration from $1 \times 10^{18}$ cm$^{-3}$ to $1 \times 10^{20}$ cm$^{-3}$, the material of the p-type cladding layer includes Mg-doped $Al_{x2}Ga_{1-x2}N$ wherein $0.3 \leq x2 \leq 1$ and a Mg-doped concentration from $5 \times 10^{16}$ cm$^{-3}$ to $5 \times 10^{22}$ cm$^{-3}$, the active layer 242 includes multiple quantum-well layers and multiple barrier layers alternately stacked wherein the material of each quantum-well layer includes undoped $Al_{x3}Ga_{1-x3}N$ wherein $0.3 \leq x3 \leq 1$, and the material of each barrier layer includes Si-doped $Al_{x4}Ga_{1-x4}N$ wherein $0.3 \leq x \leq 1$ and a Si-doped concentration from $5 \times 10^{16}$ cm$^{-3}$ to $5 \times 10^{18}$ cm$^{-3}$. An energy band gap of the n-type cladding layer or the p-type cladding layer is greater than that of an energy band gap of the barrier layers. As such, the wavelength emitting from the active layer 242 is smaller than 290 nm. However, the material or the composition ratio of the n-type semiconductor layer 241, the active layer 242 and the p-type semiconductor layer is not limited to the above mentioned.

The method further comprises patterning the light-emitting stack 24 to form a plurality of light-emitting die regions each of which comprises a mesa region to expose a part of n-type semiconductor layer 241. Then, the method further comprises forming a first electrode 25 and a second electrode 26 respectively on the exposed n-type semiconductor layer 241 and the p-type semiconductor layer 243 in each light-emitting die region for electrically connecting to external power source. Finally, the method further comprises a dicing step for dividing the plurality of light-emitting die regions into a plurality of light-emitting devices 2. The detailed structure of one of the light-emitting devices 2 is shown in FIG. 2F and described throughout the embodiment. A current spreading layer (not shown) can be formed between the p-type semiconductor layer 243 and the second electrode 26 to spread current over the p-type semiconductor layer 243.

The present embodiment provides the light-emitting stack 24 having a better epitaxial quality by blocking a significant portion of lattice defects 223 in the lattice buffer layer 22 from extending to light-emitting stack 24. Therefore, the external quantum efficiency of the light-emitting device 2 is improved.

Various other modifications will be apparent to and can be readily made by those skilled in the art without departing from the scope and spirit of the present disclosure. Accordingly, it is not intended that the scope of the claims appended hereto be limited to the description as set forth herein, but rather that the claims be broadly construed.

What is claimed is:

1. A light-emitting device, comprising:
a substrate, comprising a protrusion part and a base part;
a lattice buffer layer, formed on the substrate, wherein the lattice buffer layer comprises a first region and a second region, wherein the first region is substantially right above the protrusion part, and the second regions is substantially right above the base part; and
a recess formed in the first region of the lattice buffer layer other than the second region;
a light-emitting stack, formed on the lattice buffer layer and the recess, wherein the light-emitting stack comprises a n-type semiconductor layer, an active layer and a p-type semiconductor layer; and
a first electrode and a second electrode, electrically connected to the n-type semiconductor layer and the p-type semiconductor layer respectively.

2. The light-emitting device according to claim 1, wherein the protrusion part comprises a bottom width between 10 nm and 1000 nm and a height between 10 nm and 1000 nm.

3. The light-emitting device according to claim 1, wherein the base part comprises a bottom width between 10 nm and 3000 nm.

4. The light-emitting device according to claim 1, wherein the recess comprises a bottom reaching a top surface of each of the protrusion parts.

5. The light-emitting device according to claim 4, wherein the recess comprises a bottom width which is 1-3 times the top width of the protrusion part.

6. The light-emitting device according to claim 1, further comprising a defect-blocking structure, formed in the recess.

7. The light-emitting device according to claim 6, wherein the defect-blocking structure comprises insulating oxide or insulating nitride.

8. The light-emitting device according to claim 6, further comprising a reflective layer formed in the recess.

9. The light-emitting device according to claim 8, wherein the reflective layer is formed in the recess and between the defect-blocking structure and the lattice buffer layer.

10. The light-emitting device according to claim 8, wherein the reflective layer comprises a metal reflector or a Distributed Bragg reflector (DBR).

* * * * *